United States Patent [19]
Gardner et al.

[11] Patent Number: 5,970,331
[45] Date of Patent: Oct. 19, 1999

[54] METHOD OF MAKING A PLUG TRANSISTOR

[75] Inventors: Mark I. Gardner, Cedar Creek; Frederick N. Hause, Austin, both of Tex.

[73] Assignee: Advanced Micro Devices, Inc., Sunnyvale, Calif.

[21] Appl. No.: 09/003,981

[22] Filed: Jan. 7, 1998

[51] Int. Cl.$^6$ .............................................. H01L 21/8238
[52] U.S. Cl. ........................ 438/199; 438/218; 438/229; 438/275; 438/279; 438/154; 257/274; 257/369; 257/371
[58] Field of Search ..................... 438/197, 199, 438/218, 229, 275, 279, 149, 151, 154, FOR 163, FOR 168, FOR 174, FOR 185, FOR 216, FOR 217, FOR 218; 257/274, 369, 371

[56] References Cited

U.S. PATENT DOCUMENTS

| | | | |
|---|---|---|---|
| 4,745,086 | 5/1988 | Parrillo et al. | 437/57 |
| 5,141,891 | 8/1992 | Arima et al. | 437/44 |
| 5,166,084 | 11/1992 | Pfiester | 437/40 |
| 5,175,118 | 12/1992 | Yoneda | 437/40 |
| 5,231,038 | 7/1993 | Yamaguchi et al. | 437/40 |
| 5,538,913 | 7/1996 | Hong | 437/44 |
| 5,545,579 | 8/1996 | Liang et al. | 437/44 |
| 5,567,635 | 10/1996 | Acovic et al. | 437/43 |

OTHER PUBLICATIONS

U.S. Patent application Ser. No. 08/739,593, filed Oct. 30, 1996, entitled Method of Forming Trench Transistor with Metal Spacers (As Amended), by Mark I. Gardner et al.
U.S. Patent application Ser. No. 08/739,595, filed Oct. 30, 1996, entitled Method of Forming a Trench Transistor with Insulative Spacers (As Amended), by Mark I. Gardner et al.
U.S. Patent application Ser. No.: 08/739,566, filed Oct. 30, 1996, entitled Method of Forming Trench Transistor and Isolation Trench (As Amended), by Mark I. Gardner et al.
U.S. Patent application Ser. No. 08/739,592, filed Oct. 30, 1996, entitled Trench Transistor with Localized Source/Drain Regions Implanted Through Voids in Trench, by Mark I. Gardner et al.

(List continued on next page.)

*Primary Examiner*—Wael M. Fahmy
*Assistant Examiner*—Long Pham
*Attorney, Agent, or Firm*—Skjerven, Morrill, MacPherson, Franklin & Friel LLP

[57] ABSTRACT

A method of making a plug transistor is disclosed. The method includes providing a semiconductor substrate with an active region of a first conductivity type, providing a doped layer of a second conductivity type in the active region, forming a dielectric layer over the active region, forming an opening in the dielectric layer, implanting a dopant of the first conductivity type through the opening into a portion of the doped layer beneath the opening thereby counterdoping the portion of the doped layer and splitting the doped layer into source and drain regions, forming a gate insulator on the active region and in the opening, and forming a gate on the gate insulator and in the opening and adjacent to the dielectric layer. Preferably, a single photoresist layer provides an etch mask for the dielectric layer and an implant mask for the dopant. It is also preferred that the gate is formed by depositing a blanket layer of gate material over the dielectric layer and into the opening and then polishing the gate material so that the gate is aligned with a top surface of the dielectric layer. In a CMOS process, the method includes forming the gate insulators and gates for the N-channel and P-channel devices separately and in sequence, and also includes forming the sources and drains for N-channel and P-channel devices before forming the gate for the P-channel device. In this manner, the N-channel and P-channel devices can have gate insulators and/or gates with different materials and/or thicknesses, and little or no boron penetration occurs, thereby providing excellent threshold voltage control.

40 Claims, 5 Drawing Sheets

OTHER PUBLICATIONS

U.S. Patent application Ser. No. 08/739,596, filed Oct. 30, 1996, entitled Trench Transistor with Localized Source/Drain Regions Implanted Through Selectively Grown Oxide Layer, by Mark I. Gardner et al.

U.S. Patent application Ser. No. 08/739,597, filed Oct. 30, 1996, entitled Trench Transistor in Combination with Trench Array, by H. Jim Fulford, Jr. et al.

U.S. Patent application Ser. No. 08/739,567, filed Oct. 30, 1996, entitled Trench Transistor with Source Contact in Trench, by Mark I. Gardner et al.

U.S. Patent application Ser. No. 08/844,925, filed Apr. 21, 1997, entitled Method of Making Enhancement–Mode and Depletion–Mode IGFETS with Different Gate Thicknesses, by Mark I. Gardner.

METHOD OF MAKING A PLUG TRANSISTOR

BACKGROUND OF THE INVENTION

1. Field of the Invention

The present invention relates to integrated circuit manufacturing, and more particularly to a method of making insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide the gate. Thereafter, the gate provides an implant mask during the implantation of source and drain regions, and the implanted dopants are driven-in and activated using a high-temperature anneal that would otherwise melt the aluminum.

An important parameter in IGFETs is the threshold voltage ($V_T$), which is the minimum gate voltage required to induce the channel. In general, the positive gate voltage of an N-channel device must be larger than some threshold voltage before a conducting channel is induced, and the negative gate voltage of a P-channel device must be more negative than some threshold voltage to induce the required positive charge (mobile holes) in the channel. There are, however, exceptions to this general rule. For example, depletion-mode devices already have a conductive channel with zero gate voltage, and therefore are normally on. With N-channel depletion-mode devices a negative gate voltage is required to turn the devices off, and with P-channel depletion-mode devices a positive gate voltage is required to turn the devices off.

Complementary metal-oxide semiconductor (CMOS) circuits include N-channel and P-channel devices. CMOS manufacturing typically includes growing a single gate oxide layer for the N-channel and P-channel devices, then forming the gates for the N-channel and P-channel devices by depositing a blanket layer of polysilicon over the substrate, forming a photoresist layer over the polysilicon layer, etching portions of the polysilicon layer beneath openings in the photoresist layer, and stripping the photoresist layer. Thereafter, typically arsenic and/or phosphorus is used to dope the source and drain for the N-channel device, and boron is used to dope the source and drain for the P-channel device.

A problem encountered in P-channel devices with polysilicon gates containing a high concentration of boron is that when a thin gate oxide is used, poor threshold voltage control may arise due to unwanted boron penetration into the gate oxide, or further, into the underlying channel region. It is reported that boron will penetrate gate oxides that are less than 125 angstroms thick during a 900° C. 30-minute post-implant anneal in nitrogen. It has also been found that the presence of fluorine in the gate oxide worsens the boron penetration problem. Such fluorine can be introduced into the gate oxide if boron difluoride ($BF_2$) is the implant species. In some instances, the boron penetration may severely disruption the threshold voltage.

Alternatively, if the gate oxide or the gate is sufficiently thick to suppress boron penetration, the increased dimensions may also disrupt the threshold voltage, which is particularly undesirable for N-channel devices where the gates are usually free of boron.

Accordingly, a need exists for a method of making a transistor, particularly in CMOS processes, which improves threshold voltage control.

SUMMARY OF THE INVENTION

An object of the invention is to provide a method of making a transistor that fulfills the need in the art described above. Generally speaking, this is accomplished by forming a gate insulator and a gate in an opening in a dielectric layer after doping the source and the drain. In a CMOS process, the N-channel and P-channel devices can have gate insulators and/or gates with different materials and/or thicknesses. Furthermore, the gate for the P-channel device can be formed after forming the sources and drains in order to reduce boron penetration. As a result, the N-channel and P-channel devices can achieve excellent threshold voltage control.

In accordance with one aspect of the invention, a method of making an IGFET includes providing a semiconductor substrate with an active region of a first conductivity type, providing a doped layer of a second conductivity type in the active region, forming a dielectric layer over the active region, forming an opening in the dielectric layer, implanting a dopant of the first conductivity type through the opening into a portion of the doped layer beneath the opening thereby counterdoping the portion of the doped layer and splitting the doped layer into source and drain regions, forming a gate insulator on the active region and in the opening, and forming a gate on the gate insulator and in the opening and adjacent to the dielectric layer.

In accordance with another aspect of the invention, the method includes forming a trench in a field region of the substrate adjacent to the active region, depositing the dielectric layer into the trench to provide dielectric isolation between the active region and another active region in the substrate, and polishing the dielectric layer to provide a planar top surface.

Preferably, a single masking layer provides an etch mask for the dielectric layer and an implant mask for the dopant. It is also preferred that the gate is formed by depositing a blanket layer of gate material over the dielectric layer and into the opening and then polishing the gate material so that the gate is aligned with the top surface of the dielectric layer.

As exemplary materials, the gate is polysilicon, the gate insulator and dielectric layer are silicon dioxide, and the masking layer is photoresist.

In accordance with another aspect of the invention, a CMOS process includes forming the gate insulators and gates for the N-channel and P-channel devices separately and in sequence, and also includes forming the sources and drains for N-channel and P-channel devices before forming the gate for the P-channel device. Advantageously, the N-channel and P-channel devices can have gate insulators and gates with the desired composition and thickness, regardless of what the other device employs, and little or no boron penetration need occur since the sources and drains can be completely formed (including activation and drive-in) before the gate for the P-channel device is formed.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
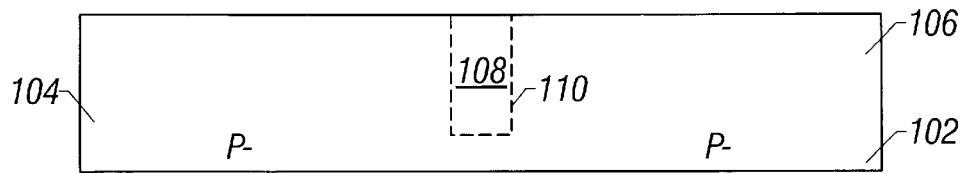
FIGS. 1A–1R show cross-sectional views of successive process steps for making N-channel and P-channel devices in accordance with an embodiment of the invention.

In the drawings, depicted elements are not necessarily drawn to scale and like or similar elements may be designated by the same reference numeral throughout the several views.

In FIG. 1A, silicon substrate 102 suitable for integrated circuit manufacture is provided. Substrate 102 includes a lightly doped P-type epitaxial surface layer on a heavily doped P-type base layer (not shown). The epitaxial surface layer has a boron background concentration on the order of $1 \times 10^{15}$ atoms/cm$^3$, a <100> orientation and a resistivity of 12 ohm-cm. The epitaxial layer includes active regions 104 and 106 and field region 108 therebetween. Broken lines 110 depict the boundary of field region 108. Active region 104 is a P-well with the same doping profile as the epitaxial surface layer, and active region 106 shall be converted into an N-well as described below.

Figure 1B:
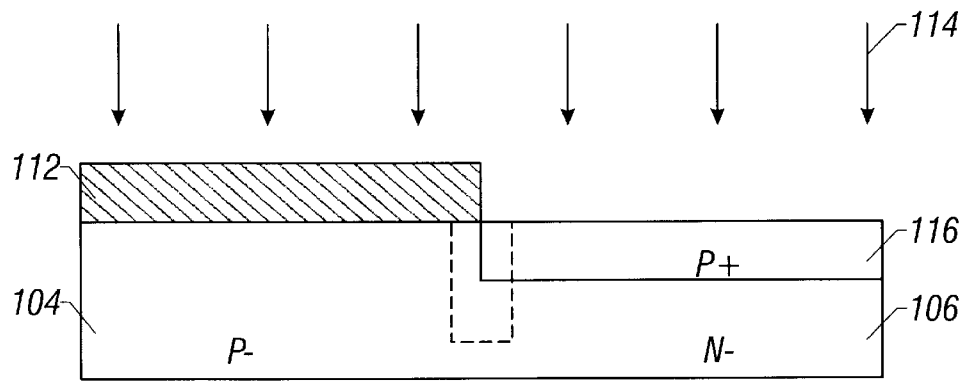

In FIG. 1B, photoresist layer 112 is deposited over the structure and patterned to selectively expose active region 106. Photoresist layer 112 is patterned using a photolithographic system, such as a step and repeat optical projection system, in which deep ultraviolet light from a mercury-vapor lamp is projected through a first reticle and a focusing lens to obtain a first image pattern. Photoresist layer 112 is then developed and the irradiated portions are removed. Photoresist layer 112 covers all of active region 104 and includes an opening above all of active region 106. Thereafter, a well implant is provided for active region 106 by subjecting the structure to ion implantation of arsenic, indicated by arrows 114, at a dose in the range of $1 \times 10^{15}$ to $5 \times 10^{15}$ atoms/cm$^2$ and an energy in the range of 50 to 300 kiloelectron-volts, using photoresist layer 112 as an implant mask. The well implant converts active region 106 into a lightly doped N-well with an arsenic background concentration on the order of $1 \times 10^{16}$ atoms/cm$^3$. Thereafter, doped layer 116 is implanted into active region 106 by subjecting the structure to ion implantation of boron, also indicated by arrows 114, at a dose in the range of $1 \times 10^{15}$ to $5 \times 10^{15}$ atoms/cm$^2$ and an energy of 15 to 30 kiloelectron-volts, using photoresist layer 112 as an implant mask. Doped layer 116 is heavily doped P-type with a boron concentration in the range of about $1 \times 10^{18}$ to $1 \times 10^{20}$ atoms/cm$^3$ and a depth of about 500 angstroms.

Figure 1C:
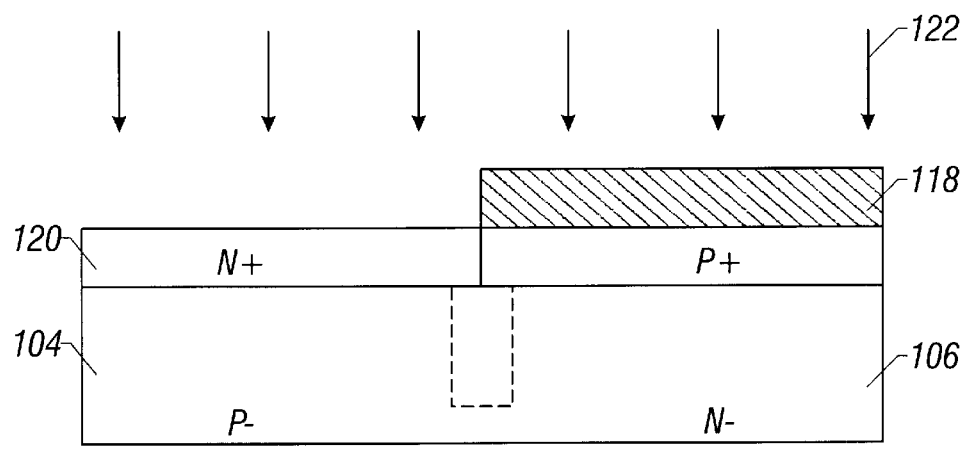

In FIG. 1C, photoresist layer 112 is stripped, and photoresist layer 118 is deposited over the structure. The photolithographic system uses a second reticle to irradiate photoresist layer 118 with a second image pattern, and the irradiated portions of photoresist layer 118 are removed so that photoresist layer 118 includes an opening over all of active region 104 while photoresist layer 118 covers all of active region 106. Thereafter, doped layer 120 is implanted into active region 104 by subjecting the structure to ion implantation of arsenic, indicated by arrows 122, at a dose in the range of $1 \times 10^{15}$ to $5 \times 10^{15}$ atoms/cm$^2$ and an energy of 2 to 30 kiloelectron-volts, using photoresist layer 118 as an implant mask. Doped layer 120 is heavily doped N-type with an arsenic concentration in the range of about $1 \times 10^{18}$ to $1 \times 10^{20}$ atoms/cm$^3$ and a depth of about 500 angstroms.

Figure 1D:
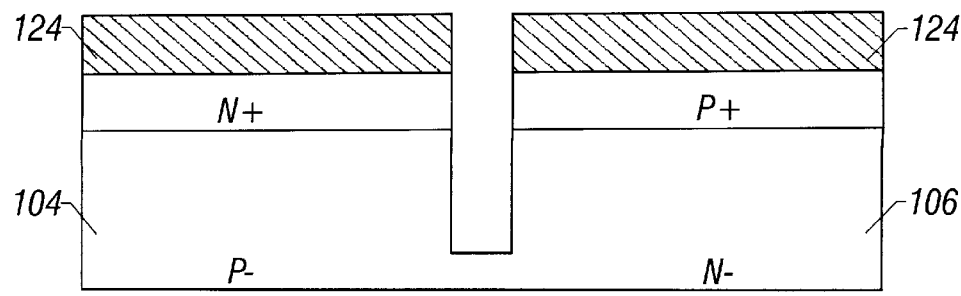

In FIG. 1D, photoresist layer 118 is stripped, and photoresist layer 124 is deposited over the structure. The photolithographic system uses a third reticle to irradiate photoresist layer 124 with a third image pattern, and the irradiated portions of photoresist layer 124 are removed so that photoresist layer 124 includes an opening over the field region 108 while photoresist layer 124 covers all of active regions 104 and 106. Thereafter, an anisotropic etch is applied that forms a trench in field region 108 using photoresist layer 124 as an etch mask.

Figure 1E:
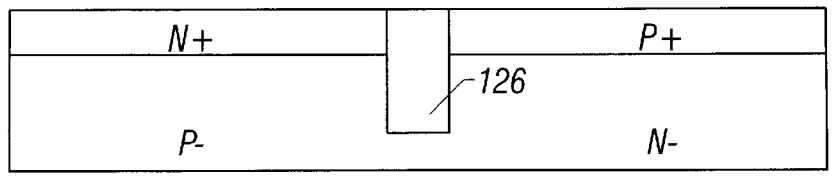

In FIG. 1E, photoresist layer 124 is stripped, and the trench in field region 108 is filled with trench oxide 126, as is conventional. If desired, a channel-stop implant can be applied.

Figure 1F:
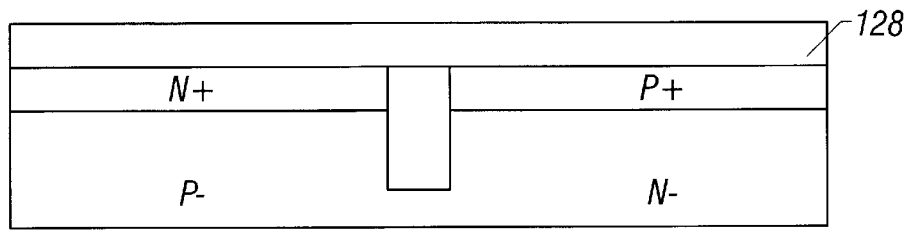

In FIG. 1F, oxide layer 128 composed of silicon dioxide with a thickness of about 2000 angstroms is conformally deposited over the exposed surfaces by plasma enhanced chemical vapor deposition (PECVD) at a temperature in the range of 350 to 450° C.

Figure 1G:
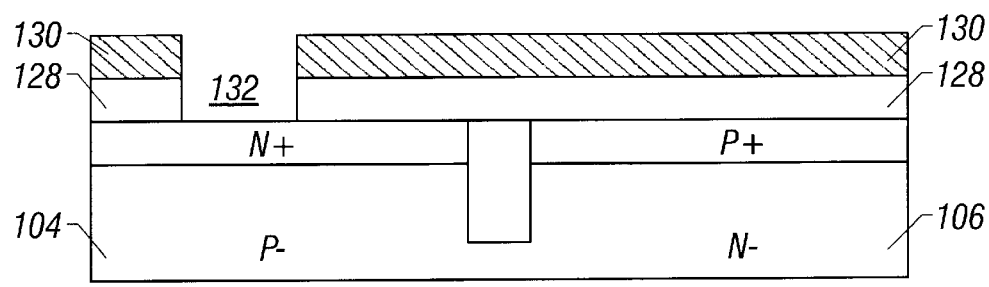

In FIG. 1G, photoresist layer 130 is deposited over the structure. The photolithographic system uses a fourth reticle to irradiate photoresist layer 130 with a fourth image pattern, and the irradiated portions of photoresist layer 130 are removed so that photoresist layer 130 includes an opening over a central portion of active region 104 while photoresist layer 130 covers all of active region 106. Thereafter, an anisotropic etch is applied that is highly selective of silicon dioxide with respect to silicon using photoresist layer 130 as an etch mask. The etch forms opening 132 in oxide layer 128. Opening 132 exposes the underlying portion of active region 104. For illustration purposes, the minimum resolution of the photolithographic system, and thus the distance between the opposing sidewalls of opening 132, is about 3500 angstroms (0.35 microns).

Figure 1H:
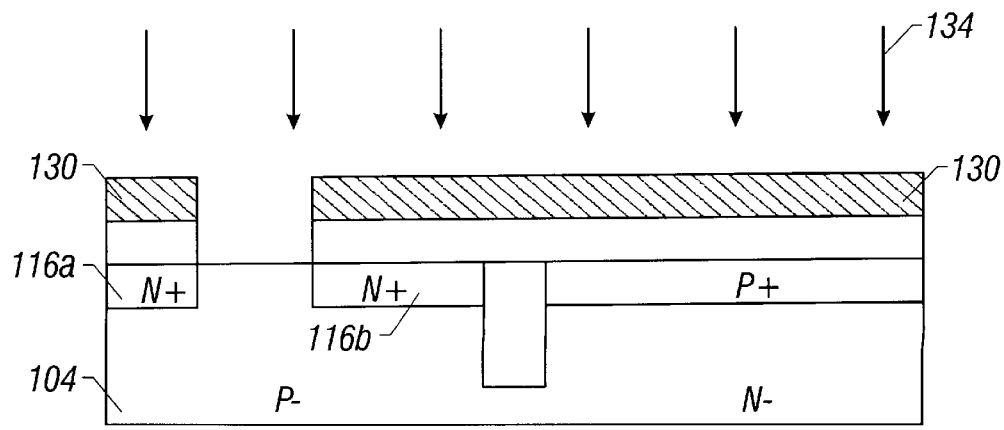

In FIG. 1H, a channel implant consisting of a well implant, then a punchthrough implant, then a threshold adjust implant is implanted into the portion of active region 104 beneath opening 132 by subjecting the structure to ion implantation of boron, indicated by arrows 134, using photoresist layer 130 as an implant mask. The well implant provides a more uniform background doping, the punchthrough implant provides greater robustness to punchthrough voltages, and the threshold adjust implant provides threshold voltage adjustment. Preferably, the well implant, punchthrough implant, and threshold adjust implant are applied with a dosage of about 2.5 times that used for doped layer 116. For instance, the well implant is provided by boron at a dose in the range of $2.5 \times 10^{15}$ to $12.5 \times 10^{15}$ atoms/cm$^2$ and an energy in the range of 100 to 170 kiloelectron-volts, the punchthrough implant is provided by boron at a dose in the range of $2.5 \times 10^{15}$ to $12.5 \times 10^{15}$ atoms/cm$^2$ and an energy in the range of 40 to 100 kiloelectron-volts, and the threshold adjust implant is provided by boron at a dose in the range of $2.5 \times 10^{15}$ to $12.5 \times 10^{15}$ atoms/cm$^2$ and an energy in the range of 2 to 30 kiloelectron-volts. As a result, the channel implant counter-dopes the portion of doped layer 116 beneath opening 132, thereby converting this portion of doped layer 116 from N-type conductivity into P-type conductivity and splitting doped layer 116 into source region 116A and drain region 116B. The portion of active region 104 exposed to the channel implant has a boron concentration on the order of $1 \times 10^{17}$ atoms/cm$^3$ and provides suitable doping for a channel region.

Figure 1I:
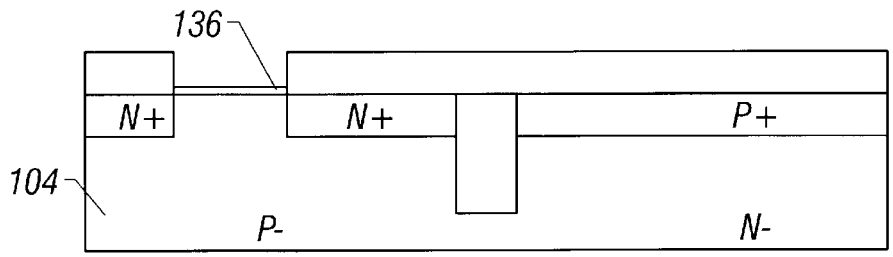

In FIG. 1I, photoresist layer 134 is stripped, and silicon dioxide 136 is thermally grown on the exposed portion of active region 104 in opening 132 using tube growth at a temperature of 700 to 1000° C. in an O$_2$ containing ambient. Silicon dioxide 136 has a thickness of about 50 angstroms, and provides a gate insulator for a subsequently formed gate.

Figure 1J:
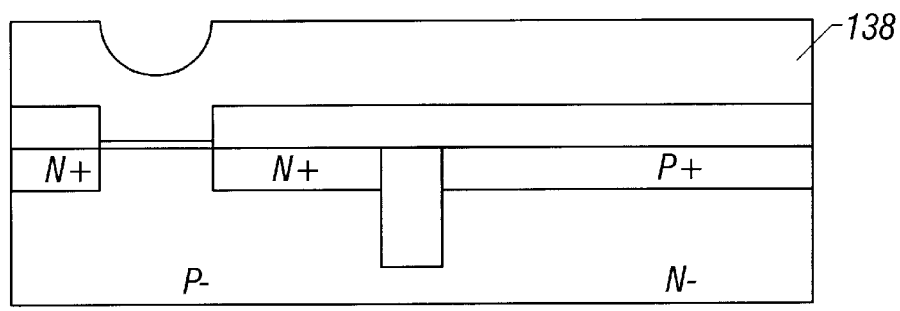

In FIG. 1J, polysilicon layer 138 with a thickness of 2500 angstroms is conformally deposited over the structure by low pressure chemical vapor deposition (LPCVD). Polysilicon layer 138 completely fills the remaining space in opening 132. Polysilicon layer 138 can be doped in situ as deposition occurs, or doped before the upcoming polishing step by implanting arsenic with a dose in the range of $1 \times 10^{15}$ to $5 \times 10^{15}$ atoms/cm$^2$ and an energy in the range of 2 to 10 kiloelectron-volts.

Figure 1K:
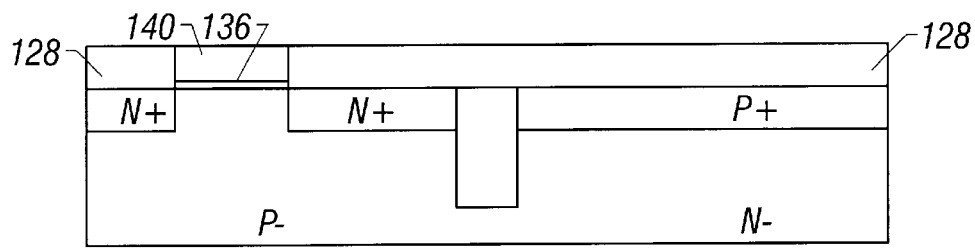

In FIG. 1K, the structure is planarized by applying chemical-mechanical polishing in the presence of an abrasive slurry that is highly selective of polysilicon with respect to silicon dioxide. The polishing grinds down polysilicon layer 138 using oxide layer 128 as a stop-layer. After polishing occurs, polysilicon layer 138 is completely removed outside opening 132, and the remaining portion of polysilicon layer 138 in opening 132 forms polysilicon gate 140. Polysilicon gate 140 has a length of about 3500 angstroms, and a thickness of about 1950 angstroms. As is seen, polysilicon gate 140 includes a bottom surface in contact with silicon dioxide 136, opposing sidewalls in contact with oxide layer 128, and a top surface aligned with the top surface of oxide layer 128.

Figure 1L:
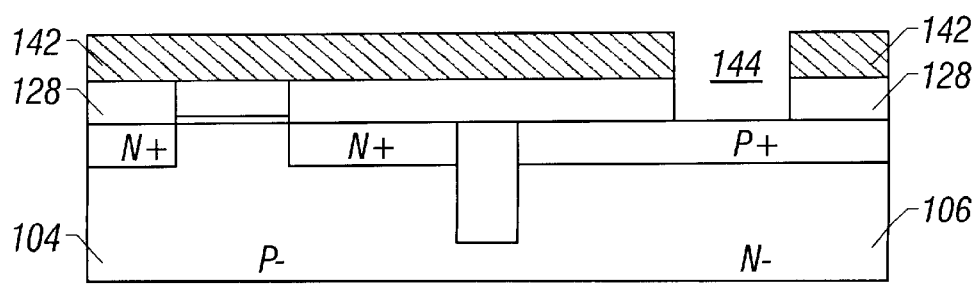

In FIG. 1L, photoresist layer 142 is deposited over the structure. The photolithographic system uses a fifth reticle to irradiate photoresist layer 142 with a fifth image pattern, and the irradiated portions of photoresist layer 142 are removed so that photoresist layer 142 includes an opening over a central portion of active region 106 while photoresist layer 142 covers all of active region 104. Thereafter, an anisotropic etch is applied that is highly selective of silicon dioxide with respect to silicon using photoresist layer 142 as an etch mask. The etch forms opening 144 in oxide layer 128. Opening 144 exposes the underlying portion of active region 106. The distance between the opposing sidewalls of opening 144 is about 3500 angstroms.

Figure 1M:
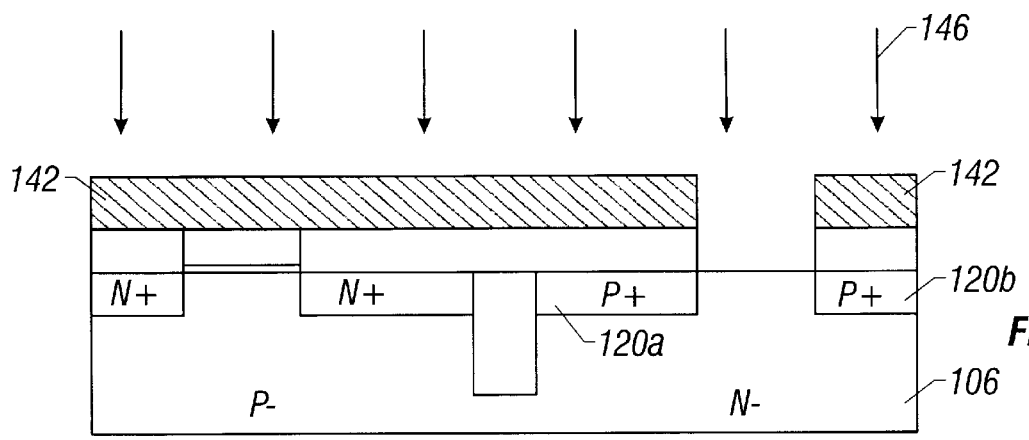

In FIG. 1M, a channel implant consisting of a well implant, then a punchthrough implant, then a threshold adjust implant is implanted into the portion of active region 106 beneath opening 144 by subjecting the structure to ion implantation of arsenic, indicated by arrows 146, using photoresist layer 142 as an implant mask. The well implant provides a more uniform background doping, the punchthrough implant provides greater robustness to punchthrough voltages, and the threshold adjust implant provides threshold voltage adjustment. Preferably, the well implant, punchthrough implant, and threshold adjust implant are applied with a dosage of about 2.5 times that used for doped layer 120. For instance, the well implant is provided by arsenic at a dose in the range of $2.5 \times 10^{15}$ to $12.5 \times 10^{15}$ atoms/cm$^2$ and an energy in the range of 500 to 1000 kiloelectron-volts, the punchthrough implant is provided by arsenic at a dose in the range of $2.5 \times 10^{15}$ to $12.5 \times 10^{15}$ atoms/cm$^2$ and an energy in the range of 300 to 500 kiloelectron-volts, and the threshold adjust implant is provided by arsenic at a dose in the range of $2.5 \times 10^{15}$ to $12.5 \times 10^{15}$ atoms/cm$^2$ and an energy in the range of 50 to 300 kiloelectron-volts. As a result, the channel implant counter-dopes the portion of doped layer 120 beneath opening 144, thereby converting this portion of doped layer 120 from P-type conductivity into N-type conductivity and splitting doped layer 120 into source region 120A and drain region 120B. The portion of active region 106 exposed to the channel implant has an arsenic concentration on the order of $1 \times 10^{17}$ atoms/cm$^3$ and provides suitable doping for a channel region.

Figure 1N:
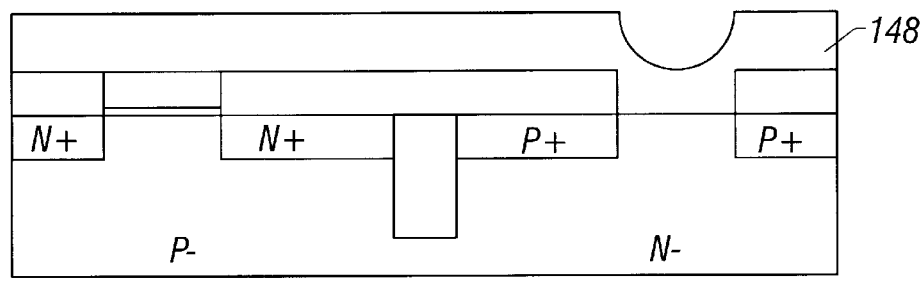

In FIG. 1N, photoresist layer 142 is stripped, and the device is annealed to remove crystalline damage and to drive-in and activate the implanted dopants by applying a rapid thermal anneal on the order of 950 to 1050° C. for 10 to 30 seconds. Thereafter, titanium oxide (TiO$_2$) layer 148 with a thickness of 2500 angstroms is conformally deposited over the structure, for instance by LPCVD, PECVD or sputtering.

Figure 1O:
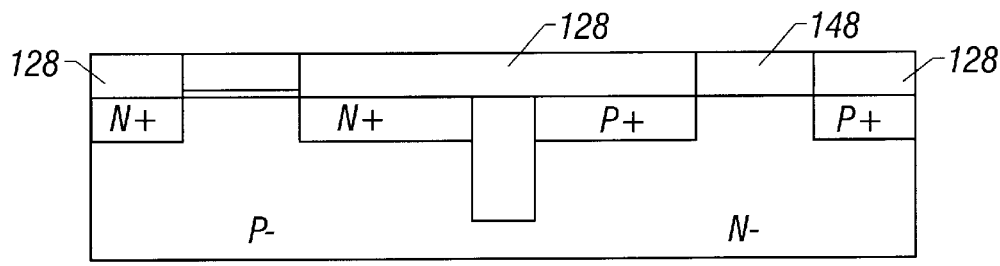

In FIG. 1O, the structure is planarized by applying chemical-mechanical polishing in the presence of an abrasive slurry that is highly selective of titanium oxide with respect to silicon dioxide. The polishing grinds down titanium oxide layer 148 and using oxide layer 128 as a stop-layer. After polishing occurs, titanium oxide layer 148 is completely removed outside opening 144, and the remaining portion of titanium oxide layer 148 in opening 144 is aligned with the top surface of oxide layer 128.

Figure 1P:
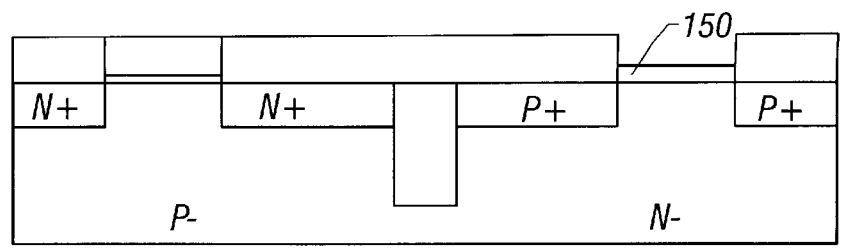

In FIG. 1P, an anisotropic etch is applied that is highly selective of titanium oxide with respect to silicon dioxide and polysilicon. The etch is carefully timed and monitored to remove an upper portion, but not a lower portion, of titanium oxide layer 148 in opening 144. After etching occurs, the lower portion of titanium oxide layer 148 in opening 144 forms titanium oxide 150 with a thickness of about 100 angstroms. Titanium oxide 150 provides a gate insulator for a subsequently formed gate.

Figure 1Q:
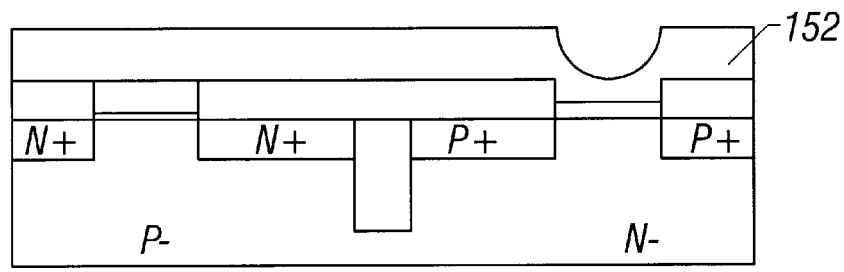

In FIG. 1Q, aluminum layer 152 with a thickness of 5000 angstroms is conformally deposited over the structure, for instance by LPCVD, PECVD or sputtering. Aluminum layer 152 completely fills the remaining space in opening 144.

Figure 1R:
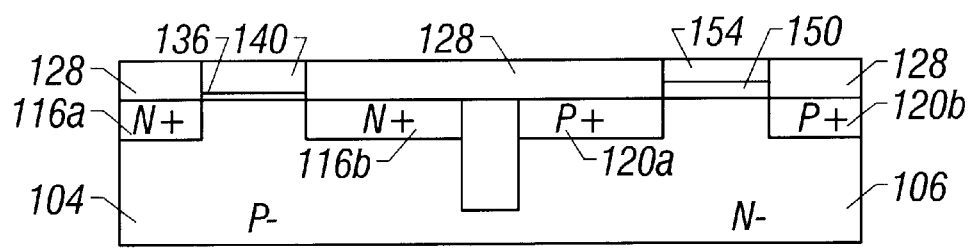

In FIG. 1R, the structure is planarized by applying chemical-mechanical polishing in the presence of an abrasive slurry that is highly selective of aluminum with respect to silicon dioxide and polysilicon. The polishing grinds down aluminum layer 152 using oxide layer 128 as a stop-layer. After polishing occurs, aluminum layer 152 is completely removed outside opening 144, and the remaining portion of aluminum layer 152 in opening 144 forms aluminum gate 154. Aluminum gate 154 has a length of about 3500 angstroms, and a thickness of about 1900 angstroms. As is seen, aluminum gate 154 includes a bottom surface in contact with titanium oxide 150, opposing sidewalls in contact with oxide layer 128, and a top surface aligned with the top surface of oxide layer 128.

In this manner, an N-channel device is formed with a source (consisting of source region 116A) and a drain (consisting of drain region 116B) in active region 104 controlled by polysilicon gate 140 using silicon dioxide 136 as a gate insulator. Likewise, a P-channel device is formed with a source (consisting of source region 120A) and a drain (consisting of drain region 120B) in active region 106 controlled by aluminum gate 154 using titanium oxide 150 as a gate insulator.

Several advantages of this embodiment can be appreciated. First, the compositions and thicknesses of the gate insulator and the gate for the N-channel and P-channel devices are independent of one another, thereby providing an added degree of design flexibility. Second, the gate for the P-channel device is formed after the sources and drains for the N-channel and P-channel devices are completely formed, including activation and drive-in. As a result, the P-channel device can employ a wide variety of materials, such as aluminum, that avoid boron penetration. Furthermore, even if the P-channel device employs a polysilicon gate doped with boron, the thermal cycle needed to activate the boron in the polysilicon gate is less severe than the source/drain anneal, which in turn reduces boron penetration.

Further processing steps in the fabrication of IGFETs typically include forming a thick oxide layer over the active regions, forming contact windows (or vias) in the oxide layer, forming conductive plugs in the contact windows, and forming a metal-1 pattern on the thick oxide layer that selectively interconnects the plugs. Thereafter, more interlevel dielectrics with conductive plugs and additional metallization patterns (such as metal-2 through metal-5) can be formed. In addition, other high-temperature process steps can be used to supplement or replace the anneal step to provide the desired anneal, activation, and drive-in functions. These further processing steps are conventional and need not be repeated herein. Likewise the principal processing steps disclosed herein may be combined with other steps readily apparent to those skilled in the art.

The present invention includes numerous variations to the embodiment described above. For instance, salicide contacts can be formed by removing the dielectric layer after forming the gates, forming spacers adjacent to the opposing sidewalls of the gates, depositing a refractory metal over the structure, applying an anneal to form salicide contacts on the gates, sources and drains, and removing the unreacted refractory metal on the spacers, as is conventional. The salicide anneal is typically on the order of 700 to 800° C., and therefore is far less severe than the source/drain anneal. Furthermore, if the gate insulators are sufficiently thick, then the spacers may not be necessary in order to prevent bridging the salicide contacts.

As another variation, the dielectric layer can fill isolation trenches in the substrate, thereby providing dielectric isolation between the active regions. If this approach is used, it is preferable to planarize the dielectric layer by polishing before forming a masking layer over the dielectric layer. Alternatively, dielectric isolation between the active regions can be formed before the doped layers (116 and 120) are implanted.

The N-channel and P-channel devices can have gate insulators with identical compositions and/or thicknesses, as well as gates with identical compositions and/or thicknesses. The gate insulators for both the N-channel and P-channel devices can be deposited or grown. Furthermore, deposited gate insulators need not necessarily entirely fill the openings in the dielectric layer and then be etched back. For instance, a thin liner of gate insulator can be deposited into the openings in the dielectric layer without subsequent etchback. The well, punchthrough and threshold adjust implants may not be essential, and various doping profiles for the source and drain can be used. In particular, lightly doped drains (LDDs) can be used, and asymmetrical source/drain doping can also be used. The active regions can be isolated from one another by various techniques such as LOCOS oxidation.

The gate can be various conductors, and the gate insulator and dielectric layer can be various dielectrics. In particular, the gate insulator can be various "high K" materials, such as titanium oxide or chromium oxide ($CrO_2$), with dielectric constants in the range of about 20 to 500. Other masking layers besides photoresist can be used, such as hard masks patterned using photolithography. Suitable N-type dopants include arsenic and phosphorus; suitable P-type dopants include boron $B_{10}$, boron $B_{11}$, and $BF_x$ species such as $BF_2$.

The invention is particularly well-suited for fabricating N-channel MOSFETs, P-channel MOSFETs and other types of IGFETs, particularly for high-performance microprocessors where high circuit density is essential. Although a single pair of N-channel and P-channel devices has been shown for purposes of illustration, it is understood that in actual practice, many devices are fabricated on a single semiconductor wafer as is widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making an IGFET, comprising the steps of:
   providing a semiconductor substrate with an active region of a first conductivity type;
   providing a doped layer of a second conductivity type in the active region;
   forming a dielectric layer over the active region;
   forming an opening in the dielectric layer;
   implanting a dopant of the first conductivity type through the opening into a portion of the doped layer beneath the opening, thereby counterdoping the portion of the doped layer and splitting the doped layer into source and drain regions;
   forming a gate insulator on the active region and in the opening; and
   forming a gate on the gate insulator and in the opening and adjacent to the dielectric layer.

2. The method of claim 1, wherein forming the dielectric layer and the opening therein includes:
   depositing the dielectric layer over the active region;
   forming a masking layer over the dielectric layer; and
   applying an etch to remove a selected portion of the dielectric layer using the masking layer as an etch mask.

3. The method of claim 1, wherein implanting the dopant includes using a masking layer that defines the opening as an implant mask.

4. The method of claim 1, wherein forming the gate insulator includes:
   depositing a gate insulator material over the dielectric layer and into the opening and on the active region;

polishing the gate insulator material so that a portion of the gate insulator material over the dielectric layer is removed and a remaining portion of the gate insulator material is in the opening; and applying an etch that is more selective of the gate insulator material than the dielectric layer, thereby removing an upper portion of the gate insulator material in the opening without removing a lower portion of the gate insulator material in the opening, wherein the lower portion of the gate insulator material forms the gate insulator.

5. The method of claim 1, wherein forming the gate includes:

depositing a layer of a gate material over the dielectric layer and into the opening; and polishing the gate material to remove portions of the gate material outside the opening so that the gate is substantially aligned with a top surface of the dielectric layer.

6. The method of claim 1, wherein substantially all of the gate is above the active region.

7. The method of claim 1, wherein the doped layer provides essentially all doping of the second conductivity type for a source in the source region and a drain in the drain region.

8. The method of claim 1, wherein forming a source and a drain includes applying a high-temperature anneal to drive-in and activate the source and drain regions of the doped layer after implanting the dopant.

9. The method of claim 1, including:

forming a trench in a field region of the substrate adjacent to the active region; and depositing the dielectric layer into the trench, thereby providing dielectric isolation between the active region and another active region in the substrate.

10. The method of claim 1, including:

removing the dielectric layer after forming the gate, thereby exposing opposing sidewalls of the gate; and forming spacers adjacent to the opposing sidewalls of the gate.

11. The method of claim 1, wherein the gate is polysilicon, and the dielectric layer is silicon dioxide.

12. The method of claim 1, wherein the steps are performed in the sequence set forth.

13. The method of claim 1, including providing an integrated circuit chip that contains the IGFET.

14. The method of claim 1, including providing an electronic system that includes a microprocessor, a memory, a system bus, and the IGFET.

15. A method of making an IGFET, comprising the steps of:

providing a semiconductor substrate with an active region of a first conductivity type;

implanting a doped layer of a second conductivity type in the active region;

depositing a dielectric layer over the doped layer;

forming a masking layer over the dielectric layer;

etching a portion of the dielectric layer beneath an opening in the masking layer using the masking layer as an etch mask, thereby forming an opening in the dielectric layer above a portion of the doped layer;

implanting a dopant of the first conductivity type through the opening in the dielectric layer into the portion of the doped layer using the masking layer as an implant mask, thereby converting the portion of the doped layer into the first conductivity type and splitting the doped layer into source and drain regions;

removing the masking layer;

forming a source in the source region and a drain in the drain region, wherein the doped layer provides essentially all doping of the second conductivity type for the source and the drain;

forming a gate insulator on the active region and in the opening in the dielectric layer;

depositing a gate material over the dielectric layer and into the opening in the dielectric layer and on the gate insulator; and polishing the gate material so that a portion of the gate material over the dielectric layer is removed and a remaining portion of the gate material in the opening in the dielectric layer forms a gate that contacts the dielectric layer and the gate insulator.

16. The method of claim 15, wherein forming the source and the drain includes applying a high-temperature anneal to drive-in and activate the source and drain regions of the doped layer after implanting the dopant.

17. The method of claim 15, wherein forming the gate insulator includes thermally growing the gate insulator on the active region.

18. The method of claim 15, wherein forming the gate insulator includes:

depositing a gate insulator material over the dielectric layer and into the opening in the dielectric layer and on the active region;

polishing the gate insulator material so that a portion of the gate insulator material over the dielectric layer is removed and a remaining portion of the gate insulator material is in the opening in the dielectric layer; and applying an etch that is more selective of the gate insulator material than the dielectric layer, thereby removing an upper portion of the gate insulator material in the opening without removing a lower portion of the gate insulator material in the opening, wherein the lower portion of the gate insulator material forms the gate insulator.

19. The method of claim 15, wherein all of the gate is above the active region.

20. The method of claim 15, including:

forming a trench in a field region of the substrate adjacent to the active region; and depositing the dielectric layer into the trench, thereby providing dielectric isolation between the active region and another active region in the substrate.

21. The method of claim 20, including polishing the dielectric layer to planarize the dielectric layer before forming the masking layer.

22. The method of claim 15, wherein the first conductivity type is P-type, and the second conductivity type is N-type.

23. The method of claim 15, wherein the gate material is polysilicon, the dielectric layer is silicon dioxide, and the masking layer is photoresist.

24. The method of claim 15, wherein the steps are performed in the sequence set forth.

25. A method of making complementary transistors, comprising the steps of:

providing a semiconductor substrate with a first active region of a first conductivity type and a second active region of a second conductivity type;

implanting a first doped layer of the second conductivity type in the first active region;

implanting a second doped layer of the first conductivity type in the second active region;

depositing a dielectric layer over the first and second active regions;

forming a first masking layer over the dielectric layer, wherein the first masking layer includes an opening above a portion of the first active region and the first masking layer covers all of the second active region;

etching a portion of the dielectric layer beneath the opening in the first masking layer using the first masking layer as an etch mask, thereby forming a first opening in the dielectric layer above a portion of the first doped layer;

implanting a dopant of the first conductivity type through the first opening in the dielectric layer into the portion of the first doped layer using the first masking layer as an implant mask, thereby converting the portion of the first doped layer into the first conductivity type and splitting the first doped layer into first source and drain regions in the first active region;

forming a first source in the first source region and a first drain in the first drain region, wherein the first doped layer provides essentially all doping of the second conductivity type for the first source and the first drain;

forming a first gate insulator on the first active region and in the first opening;

depositing a first gate material over the dielectric layer and into the first opening and on the first gate insulator;

polishing the first gate material so that a portion of the first gate material over the dielectric layer is removed and a remaining portion of the first gate material in the first opening forms a first gate that contacts the dielectric layer and the first gate insulator;

forming a second masking layer over the dielectric layer, wherein the second masking layer includes an opening above a portion of the second active region and the second masking layer covers all of the first active region;

etching a portion of the dielectric layer beneath the opening in the second masking layer using the second masking layer as an etch mask, thereby forming a second opening in the dielectric layer above a portion of the second doped layer;

implanting a dopant of the second conductivity type through the second opening in the dielectric layer into the portion of the second doped layer using the second masking layer as an implant mask, thereby converting the portion of the second doped layer into the second conductivity type and splitting the second doped layer into second source and drain regions in the second active region;

forming a second source in the second source region and a second drain in the second drain region, wherein the second doped layer provides essentially all doping of the first conductivity type for the second source and the second drain;

forming a second gate insulator on the second active region and in the second opening;

depositing a second gate material over the dielectric layer and into the second opening and on the second gate insulator; and polishing the second gate material so that a portion of the second gate material over the dielectric layer is removed and a remaining portion of the second gate material in the second opening forms a second gate that contacts the dielectric layer and the second gate insulator.

26. The method of claim 25, wherein the first and second active regions are adjacent to a dielectric isolation region in the substrate.

27. The method of claim 26, wherein forming the dielectric isolation region includes:

forming a trench in a field region of the substrate adjacent to and between the first and second active regions; and depositing the dielectric layer into the trench.

28. The method of claim 27, including polishing the dielectric layer to planarize the dielectric layer before forming the first masking layer.

29. The method of claim 25, wherein substantially all of the first and second gates are above the first and second active regions.

30. The method of claim 25, wherein the first and second gate insulators are different materials.

31. The method of claim 25, wherein the first and second gate insulators have different thicknesses.

32. The method of claim 25, wherein the first and second gate insulators are different materials and have different thicknesses.

33. The method of claim 25, wherein the first and second gates are different materials.

34. The method of claim 25, wherein the first and second gates have different thicknesses.

35. The method of claim 25, wherein the first and second gates are different materials and have different thicknesses.

36. The method of claim 25, wherein the first and second gate insulators are different materials and have different thicknesses, and the first and second gates are different materials and have different thicknesses.

37. The method of claim 25, wherein the first gate is polysilicon, the first and second masking layers are photoresist, the first conductivity type is P-type, and the second conductivity type is N-type.

38. The method of claim 25, including forming the first gate insulator, the first gate, the second gate insulator, and the second gate in the sequence set forth.

39. The method of claim 25, including forming the second source and the second gate in the sequence set forth.

40. The method of claim 25, wherein the steps are performed in the sequence set forth.

* * * * *